United States Patent [19]

Mukherjee

[11] Patent Number: 5,216,423
[45] Date of Patent: Jun. 1, 1993

[54] METHOD AND APPARATUS FOR MULTIPLE BIT ENCODING AND DECODING OF DATA THROUGH USE OF TREE-BASED CODES

[75] Inventor: Amae Mukherjee, Maitland, Fla.

[73] Assignee: University of Central Florida, Orlando, Fla.

[21] Appl. No.: 682,735

[22] Filed: Apr. 9, 1991

[51] Int. Cl.⁵ .......................... H03M 7/00; H03M 7/42
[52] U.S. Cl. ........................................ 341/79; 341/106
[58] Field of Search .................... 341/106, 79, 89, 148, 341/126, 108, 144, 155

[56] References Cited

U.S. PATENT DOCUMENTS

| | | | |
|---|---|---|---|
| 3,835,467 | 9/1974 | Woodrum | 341/79 X |
| 3,883,847 | 5/1975 | Frank | 341/106 X |
| 3,895,185 | 7/1975 | Ramsey | 341/79 X |
| 3,921,143 | 11/1975 | Woodrum | 341/79 X |
| 4,311,989 | 1/1982 | Roux | 341/89 |
| 4,475,174 | 10/1984 | Kanayama | 341/67 X |
| 4,591,829 | 5/1986 | Takeda | 341/106 X |
| 4,853,696 | 8/1989 | Mukherjee | 341/65 |
| 4,990,910 | 2/1991 | Takishima et al. | 341/79 |
| 5,021,782 | 6/1991 | Perron et al. | 341/79 X |

Primary Examiner—Sharon D. Logan
Attorney, Agent, or Firm—James H. Beusse

[57] ABSTRACT

A decoder/encoder apparatus is provided which can be programmed to decode data and to encode data. To encode data, a memory within the apparatus is preloaded with a first memory map which is descriptive of a selected tree-based binary code. The first memory map is a reverse tree representation of the selected tree-based binary code. Data is then provided to the apparatus and is processed as specified by the first memory map thus generating encoded data. To decode data, the same memory is preloaded with a second memory map which is descriptive of the same selected tree-based binary code. The second memory map is a tree representation of the same selected tree-based binary code. Encoded data is then provided to the apparatus and is processed as specified by the second memory map thus generating decoded data.

10 Claims, 4 Drawing Sheets

METHOD AND APPARATUS FOR MULTIPLE BIT ENCODING AND DECODING OF DATA THROUGH USE OF TREE-BASED CODES

BACKGROUND OF THE INVENTION

This invention relates in general to encoding and decoding devices and, more particularly, to devices and methodology which are employed for data compression and decompression of binary codes.

Many recent advances have been made in data storage and communications media. However, the explosive proliferation of information and the continuous growth of data applications are outgrowing technological advances in storage devices and communication tools. Data compression offers an attractive approach to alleviate many of the problems associated with data proliferation. Among its many benefits are reduction in data storage requirements, reduction in the cost of communication within distributed networks, reduction in the cost of backup and recovery in computer systems, increased security and efficient search operations on compressed index structures of files. In recent years, the demand for data compression and the need to develop faster and more efficient compression methods have increased considerably due to the increased usage of data compression with scientific and statistical databases, document delivery systems and communication networks.

SUMMARY OF THE INVENTION

Accordingly, one object of the present invention is to provide a encoder/decoder apparatus which operates sufficiently fast that real time compression or decompression can be achieved.

Another object of the present invention is to provide is to provide an encoder/decoder apparatus that can be programmed to encode and decode different binary codes.

In accordance with the present invention, a method is provided for encoding data in an encoder including a memory having a plurality of memory locations containing data for simultaneous generation of multiple bits of tree-based binary codes in a single memory access cycle. The method includes the step of preloading the memory with a memory map descriptive of a selected multiple bit tree-based binary code, the memory map being a reverse tree representation of the selected multiple bit tree-based binary code. The method further includes the steps of providing data to the encoder, and encoding multiple bits of the data in each memory access cycle as specified by the memory map to generate encoded data. The preloading step includes loading an encoding tree into the memory, the encoding tree being a multiple bit reverse binary tree including a root node and a plurality of leaf nodes. The leaf nodes are mapped into the memory locations within the memory in one to one correspondence therewith.

In another embodiment of the method of the present invention, a method is provided for decoding data in an decoder including a memory having a plurality of memory locations, each memory location containing data for simultaneous decoding of multiple bits of a tree-based binary code in a single memory cycle. The method includes the step of preloading the memory with a memory map descriptive of a selected multiple bit tree-based binary code. The method further includes the steps of providing data to the decoder and decoding multiple bits of the data in each memory access cycle as specified by the memory map to generate decoded data. The preloading step includes loading a decoding tree into the memory, the decoding tree including a root node and a plurality of leaf nodes. The leaf nodes are mapped into the memory locations within the memory in one to one correspondence therewith.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings in which:

DETAILED DESCRIPTION OF THE INVENTION

Before discussing the decoder/encoder apparatus of the present invention in detail, it is helpful to first understand the tree-based binary codes which the decoder/encoder apparatus employs. The term "tree-based" code means the set of codings which can be represented by a binary tree such as that shown in FIG. 1, for example. The letter characters a, b, ... g located at leaf nodes 2, 6, 7, 8, 9, 10 and 12 represent the symbols to be encoded in accordance with the particular selected code. The root of the tree is designated as root 15. The sequence of 1's and 0's in the unique path from root 15 to a leaf node represents the unique code for that symbol. The relationship between the symbol and corresponding codes of the tree in FIG. 1 will be made clear by Table 1 below.

TABLE 1

| | |
|---|---|
| a | 010 |
| b | 011 |
| c | 100 |
| d | 00 |
| e | 101 |
| f | 110 |
| g | 1110 |

Figure 1:
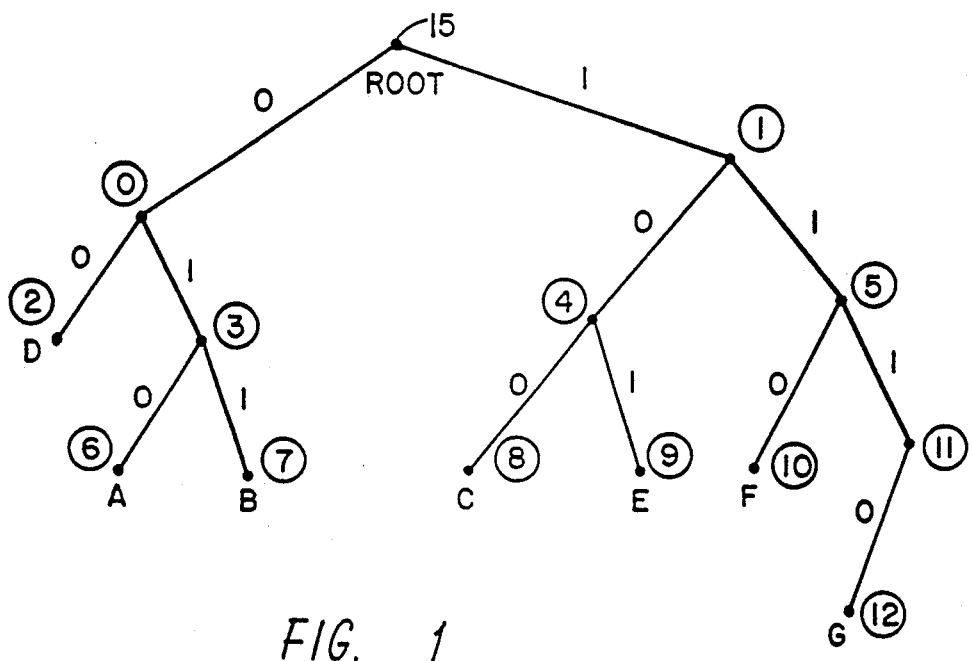
FIG. 1 is a single bit tree representing a variable length binary code using a prior art single bit process.

In accordance with the code embodied in the binary tree of FIG. 1, the character or symbol "a" is represented by the code 010. This is derived by starting at the root node 15 and traversing the shortest direct path to the leaf node which represents "a", namely leaf node 6. When traversing this path from root node 15 to leaf node 0 to leaf node 3 and then finally to leaf node 6, it is observed that the corresponding code is 010. This again confirms the symbol-code relationship shown in Table 1.

In a similar manner, to determine the code which represents the symbol "g", we start at root node 15 and proceed along the shortest direct path to the leaf node which represents "g", namely leaf node 12. In so doing it is seen that the code for the symbol "g" is 1110. This again confirms the symbol-code relationship shown in Table 1.

Tree based codes represent a large class of instantaneously decodable variable-length encoding schemes such as Huffman codes, Shannon-Fano codes, universal codes of Elias, the Fibonacci codes and the like. It is noted that the code depicted in the tree diagram of FIG. 1 is a variable length Huffman code.

Figure 2:
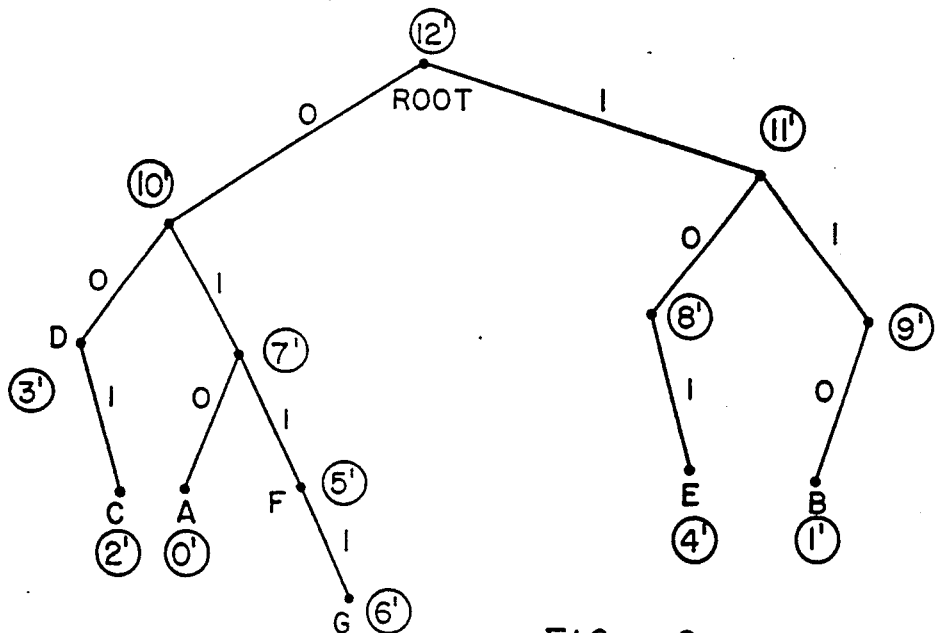
FIG. 2 is a prior art reverse binary tree for the tree of FIG. 1.

To understand the compression/decompression apparatus and methodology of the present invention it is also helpful to understand reverse binary tree structures such as that depicted in FIG. 2. The binary tree of FIG. 2 is the reverse binary tree for the tree of FIG. 1. It is noted that the root in the reverse binary tree of FIG. 1 is different from root 15 of the binary tree of FIG. 1. The root of the reverse binary tree of FIG. 2 is labelled as root 12'. The leaf nodes of the reverse binary tree are designated 0', 1', 2', ... 11'.

The reverse binary tree is useful in encoding or compressing symbols. To encode a symbol in accordance with the reverse binary tree of FIG. 2, we start at a leaf node representing that symbol and then proceed along the shortest direct path to the root node 12'. For example, to encode the symbol "g", we start at leaf node 6' and then proceed to leaf node 5' and to leaf node 7' and to leaf node 10' and then to root node 12'. When traversing this path it is observed that the corresponding code to the symbol "g" is 1110.

Figure 3:
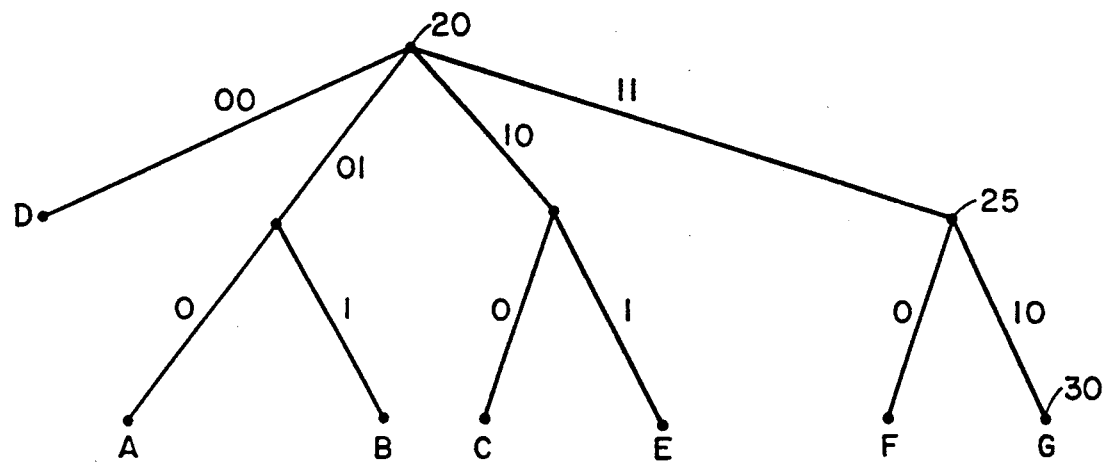
FIG. 3 is a 2 bit tree of the present invention corresponding to the 1 bit tree of FIG. 1.

For the purpose of developing multiple bit encoding and decoding schemes which will be discussed later in more detail, a k-bit tree associated with a code is now defined as follows: Each edge of such k-bit tree corresponds to the encoding of a maximum of k bits of the code. If the length of the code is n, it is represented by a sequence of [n/k] labels in the unique path from the root node to the leaf node of which only the last edge leading to the leaf node could possibly have a label with less than k bits. It will thus be appreciated that the tree of FIG. 1 is a 1 bit tree. The corresponding 2 bit tree for the same code is shown in FIG. 3. Stated alternatively, the 2 bit tree of FIG. 3 corresponds to the 1 bit tree of FIG. 1 and represents the same code. The 2 bit tree of FIG. 3 is read in substantially the same manner as the 1 bit code of FIG. 1, namely by starting at root 20 and traversing the shortest direct path to the symbol for which coding is desired. For example, to encode the symbol "g", we start at root 20 and then proceed to leaf node 25 and then to leaf node 30. In so doing, it is again observed that the code for the symbol "g" is 1110.

Figure 4:
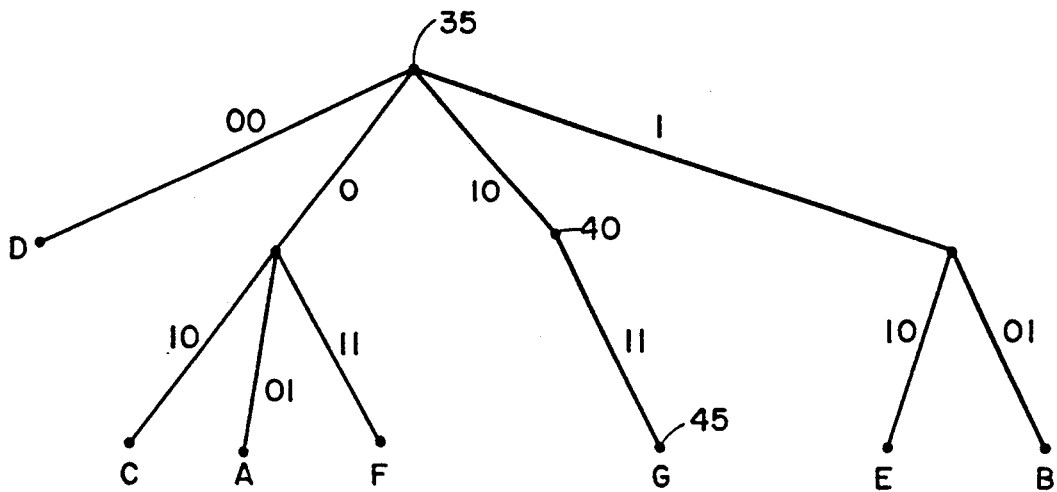
FIG. 4 is a 2 bit reverse tree of the present invention corresponding to the 1 bit reverse tree of FIG. 2.

In a similar manner, a k bit reverse tree is defined. In the case of the k bit reverse tree, a sequence of 0's and 1's which are read from the leaf node to the root node specify the unique code for a particular symbol. The reverse binary tree of FIG. 2 represents a 1 bit reverse tree. FIG. 4 depicts the 2 bit reverse binary tree corresponding to the same code as the code represented by the reverse binary tree of FIG. 2. The algorithm to obtain a k bit reverse tree is very similar to the algorithm for the reverse binary tree and the complexity of the construction is linearly proportional to the total length of the binary codes of all the symbols.

The 2 bit reverse tree of FIG. 4 is read in substantially the same manner as the 1 bit code of FIG. 2, namely by starting at the leaf node corresponding to the symbol for which coding is desired and then traversing the shortest direct path from that leaf node to the root node. For example, to encode the symbol "g", we start at leaf node 45 and then proceed to node 40 and then to root node 35. In so doing, it is once again observed that the code for the symbol "g" is again 1110.

A memory map of a k bit decoding tree is formed as discussed subsequently. It is assumed that there are n nodes in a k bit decoding tree of which there are p nodes ($p < n$) $N_1, N_2, \ldots, N_p$ which are non-leaf and each having at least two child nodes. The remaining nodes $N_{p+1}, \ldots N_n$ are either leaf nodes or non-leaf nodes with only one child. It is assumed that the node $N_i (1 \leq i \leq p)$ has c child nodes. From this it is clear that $1 < c \leq 2^k$. Let the leading edge to the "t th" child ($1 \leq t \leq c$) have a label $L_t^i = x_1 x_2 \ldots x_s$ where $s \leq k$ and $x_i (1 \leq i \leq s)$ is a binary integer 0 or 1. An integer $B_t^i$ is associated with $L_t^i$ and is defined as:

$$B_t^i = \sum_{(i=1)}^{s} 2^{k-i} x_i$$

The set of numbers $\{B_1^i, B_2^i, \ldots B_c^i\}$ are all distinct since the label $L_t^i$ obeys the prefix property. In other words, no label is a prefix of another label. A positive integer variable $M_i$ is associated with $N_i$. A set of c numbers Mem($N_i$) is associated with $N_i$ as Mem($N_i$) = $\{M_i + B_t^i\}$, t = 1, 2, ..., c.

An assignment of integer values to the sets of numbers Mem($N_i$), i = 1, ..., p such that no two integer values are equal will be called a memory map of the k bit decoding tree. It is assumed that there are q unassigned leaf nodes constituting a subset of the nodes ($N_{p+1}, \ldots N_n$). Each of the unassigned leaf nodes is mapped to a distinct positive integer outside the memory map. The set thus formed is called a terminal map for the k bit tree. The union of the memory map and the terminal map is defined to be the total memory map.

Figure 5:
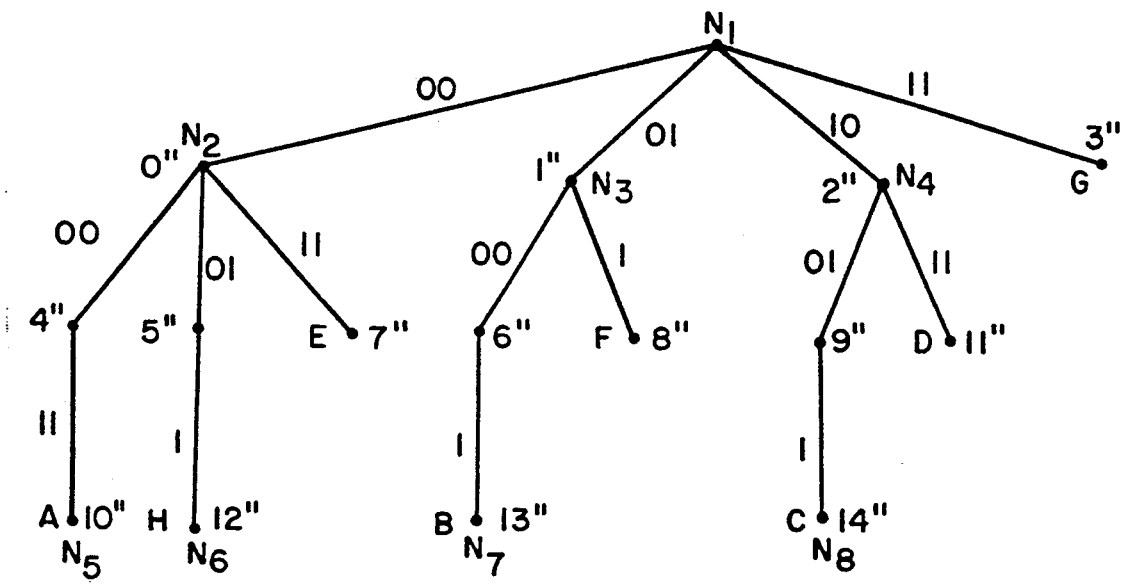
FIG. 5 is a 2 bit tree of the present invention for a Fibonacci code.

The following example will be helpful to further clarify the above discussed memory mapping step. A 2 bit code corresponding to a Fibonacci code is depicted in FIG. 5. The nodes of the tree are generally referred to as nodes 0", 1", 2" ... 14", some of which have alternative designations $N_1, N_2, \ldots N_8$ as seen in FIG. 5. The root node is designated $N_1$. The memory map assigns unique positive integers to the children of nodes $N_1, N_2, N_3$ and $N_4$ where Mem($N_1$) = $\{M_1 + 0, M_1 + 1, M_1 + 2, M_1 + 3\}$ Mem($N_2$) = $\{M_2 + 0, M_2 + 1, M_2 + 3\}$ Mem($N_3$) = $\{M_3 + 0, M_3 + 2\}$ Mem($N_4$) = $\{M_4 + 1, M_4 + 3\}$ Assigning $M_1 = 0$, $M_2 = 4$, $M_3 = 6$ and $M_4 = 8$ produces a solution as given in FIG. 5 by the numbers adjoining each node. For the leaf nodes, we can take the terminal map to be $N_5 \rightarrow 10$, $N_6 \rightarrow 12$, $N_7 \rightarrow 13$ and $N_8 \rightarrow 14$ thus producing a total map.

It is noted that for the above example, it was possible to map all nodes of the tree (excluding the root node) to a set of consecutive integers. Such a map is referred to as a "perfect map". In general, a perfect map is not always possible. For example, the sets $\{M_1+0, M_1+1, M_1+2, M_1+3\}, \{M_2+0, M_2+2\}$ and $\{M_3+0, M_3+1\}$ do not produce a perfect map. An acceptable or good map is one that maximizes the use of consecutive integers. Assuming that the map uses integers 0 through $N-1$ with W unassigned integers, the ratio W/N will be called the gap, g, of the map. It is noted that a perfect map exhibits no gap. The ratio $(n-1)/N$ is defined to be the efficiency of the map. It will thus be appreciated that for a perfect map, $g=0$ and the efficiency=100%. A sufficient condition for a perfect map is known.

It is also noted that a 1 bit binary decoding tree has a perfect map. This is so because each non-leaf node of $N_1, N_2, \ldots N_p$ has two children corresponding to labels 0 and 1. Assigning the first p even integers (i.e. 0, 2, .. . $2(p-1)$) to the left child of $N_1, N_2, \ldots N_p$ respectively will result in a perfect map.

Figure 6:
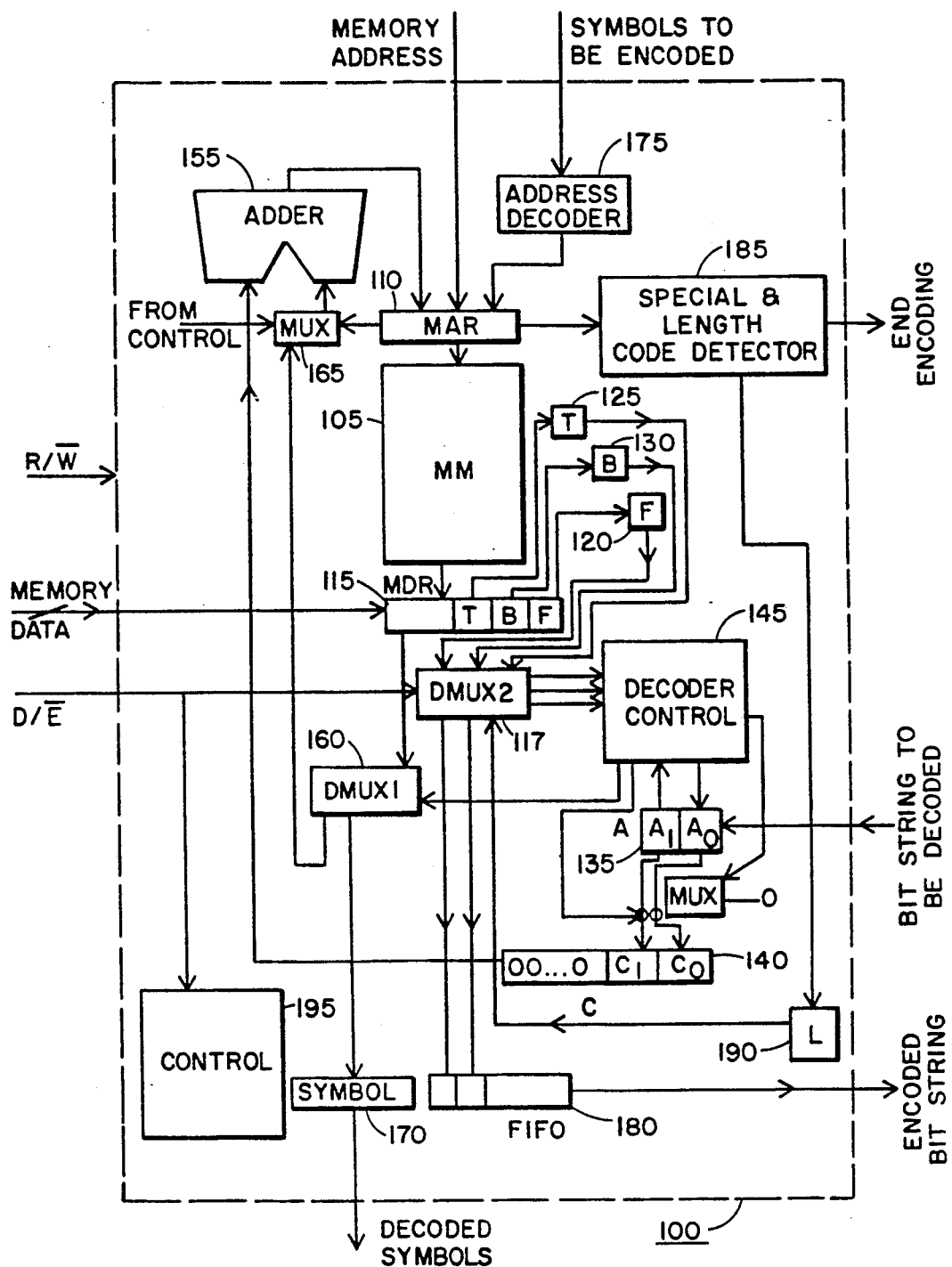
FIG. 6 is a schematic diagram of the architecture of the decoder/encoder apparatus of the present invention.

FIG. 6 shows one embodiment of the decoder/encoder architecture of the present invention as decoder/encoder device 100. It is noted that this architecture combines both decoding and encoding features. The decoding feature of this architecture is now discussed.

For purposes of example it is assumed that it is desired to decode data which has been coded in accordance with the code represented in FIG. 5. Associated with the 2 bit decoding tree of FIG. 5 representing the selected code, a state machine is defined which includes the following hardware as shown in FIG. 6. More particularly, device 100 includes a memory (MM) 105 having N storage locations and further including a memory address register (MAR) 110. The memory address register (MAR) 110 is decoded to activate the word line of memory (MM) 105. Device 100 includes a memory data register 115 (MDR) and three state flip-flops designated F, T and B and respectively labelled 120, 125 and 130. The output of memory (MM) 105 is coupled to the input of memory data register (MDR) 115. Device 100 also includes two 2-bit shift registers $A=(a_1a_0)$ and $C=(c_1c_0)$ which are labelled 135 and 140, respectively.

The input string of data which is to be decoded can be shifted either one or two bits at a time into register A (135). Each node except the root node of the decoding tree is mapped on to the memory locations in one to one fashion in memory 105 as given by the memory map discussed earlier. A decoder control circuit 145 generates the necessary control signals to perform timing operations within device 100. A multiplexor 150 is coupled between shift register (A) 135 and decoder control 145. The output of shift register (C) 140 is coupled to one input of a two input adder 155. One output of decoder control circuit 145 is coupled via demultiplexor (DMUX1) 160 to a multiplexor 165, the output of which is coupled to a second input of adder 155 as shown in FIG. 6. The output of adder 155 is coupled to an input of memory address register (MAR) 110. One output of DMUX1 is coupled to an output buffer (SYMBOL) 170 at which the decoded symbol is provided for output.

For purposes of example, the memory map of the 2 bit decode tree of FIG. 5 is shown below in Table 2.

TABLE 2

| MEMORY LOCATION | NEXT ADDRESS/SYMBOL | t | b | f |
|---|---|---|---|---|
| 0 | 4 | 0 | 0 | 0 |
| 1 | 6 | 0 | 0 | 1 |
| 2 | 8 | 0 | 0 | 0 |

TABLE 2-continued

| MEMORY LOCATION | NEXT ADDRESS/SYMBOL | t | b | f |
|---|---|---|---|---|
| 3 | g | 1 | 0 | 0 |
| 4 | 7 | 0 | 0 | 0 |
| 5 | 10 | 0 | 0 | 1 |
| 6 | 11 | 0 | 0 | 1 |
| 7 | e | 1 | 0 | 0 |
| 8 | f | 1 | 0 | 0 |
| 9 | 12 | 0 | 0 | 1 |
| 10 | a | 1 | 0 | 0 |
| 11 | d | 1 | 0 | 0 |
| 12 | h | 1 | 0 | 0 |
| 13 | b | 1 | 0 | 0 |
| 14 | c | 1 | 0 | 0 |

Each memory word exhibits the format described as follows. If the memory location corresponds to a terminal symbol, then the symbol (or pointer to the symbol) is written in the symbol field and the least significant two bits t and b are set to 1 and 0, respectively.

Each memory word exhibits the format described as follows in Table 3.

TABLE 3

MEMORY WORD FORMAT

| ←—8—→ | 1 | 1 | 1 |
|---|---|---|---|
| ADDRESS/SYMBOL | t | b | f |

| | | | |
|---|---|---|---|
| A regular non-terminal → | 0 | 0 | 0 |
| A nonterminal with 2 backups → | 0 | 1 | 1 |
| A nonterminal with backup 0 → | 0 | 1 | 0 |
| A nonterminal with backup 1 → | 0 | 0 | 1 |
| A terminal node → | 1 | 0 | 0 |

The decoding method implemented by decoding/encoding device 100 is given below by the following steps.

```
Begin
    Load Memory with Memory map table; MAR←start
        address of the map table
    Initialize T, B and F
    While (bit string to be decoded not exhausted) do
        case
            (F=0, B=0):        Shift two input bits to
(a₁,a₀)
            (F=1, B=1):        shift one input bit to a₁;
        a₀←0
            else:              shift one input bit to a₁
                               if (a₁=F) then a₀←0
                               else shift one input bit to
        a0
        end case
        c₁←a₁; c₀←a₀
        MAR ← MAR+C
        Fetch Memory word:
        If T₁=1 then {output symbol};
            MAR←start address of memory map table;
            Initialize T, B, and F again}
        else {MAR ← MDR [11...3];
            F ← MDR [0];
            B ← MDR [1];
            T ← MDR [2];
end
```

It is noted that, in decoder/encoder device 100, encoder circuitry is included together with the decoder circuitry already discussed above. Symbols to be encoded are provided to the input of an address decoder 175, the output of which is coupled to an input of memory address register (MAR) 110. Two outputs of demultiplexor (DMUX2) 117 are coupled to respective bit locations in a first in first out (FIFO) shift register 180. The encoded bit string appears at the output of FIFO shift register 100. It will be clear from the following discussion that the encoder portion of decoder/encoder device 100 shares much of the circuitry of device 100 which is employed for decoding operations. One output of memory address register (MAR) 110 is coupled to an input of a special end code and length code detector 185, the output of which is designated as END ENCODING. Detector 185 is capable of detecting a special end code and is further capable of performing length code detection. Code detector 185 is coupled to the input of a control flip-flop (L) 190 having two output lines which are coupled respectively to two bit locations within FIFO register 180 as shown in FIG. 6.

Figure 7:
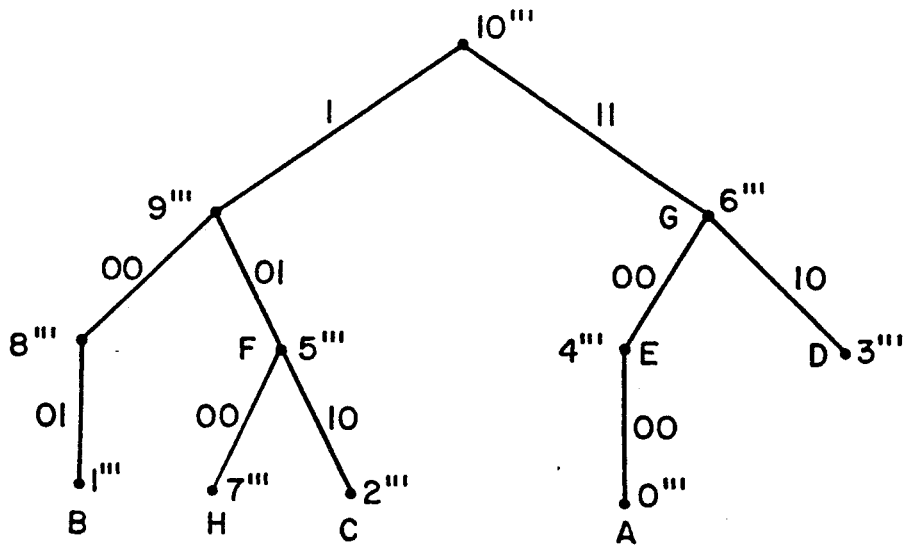
FIG. 7 is a reverse tree for the tree of FIG. 5.

The operation of the encoding process implemented in the memory-based hardware decoder/encoder device 100 of FIG. 6 depends in part on the concept of the reverse binary tree discussed earlier. For discussion purposes, the reverse tree of FIG. 7 will be employed. The tree of FIG. 7 is the reverse tree for the 2 bit code represented by the binary tree of FIG. 5. The nodes of the reverse tree are generally referred to as nodes 0''', 1''', 2'''. . . 10''' as seen in FIG. 7. The root node is designated 10'''.

In accordance with the invention, each node of the reverse tree of a selected binary code is mapped onto a unique address in memory (MM) 105. This address can be arbitrary, but to simplify the address decoding hardware in one embodiment of the invention, the fixed length binary word representing the symbol is taken to be the memory location associated with that symbol. Thus, for the example of FIG. 7, which is a reverse binary tree for the code represented in the binary tree of FIG. 5, we associate address 0''' through 7''' to symbols a, b, c, d, e, f, g and h, respectively and then assign address 8''' through 10''' to the remaining nodes. Each memory word includes two fields, namely, the "next address field" and the "encoded bit" field. The next address field for the root node 10''' is filled with a special code for designating the end of the encoding process. The next address field of any node other than the root node is the address of its parent node. A tag bit L when set to 1, indicates that only the least significant one bit has to be taken as the label of the edge. For example, this happens only for the transition from node 9''' to node 10'''.

The encoding method implemented by decoding/encoding device 100 is given below by the following steps. The symbol to be encoded is used as the initial address to fetch the first encoded field. Thereafter, it proceeds to the next address and reads out the encoded bit or bit pair. The process is repeated unless the next address field of the root node is reached indicating end of the encoding process for that symbol. The next symbol is then read from the input buffer (not shown) coupled to the input of address decoder 175 and the entire process is repeated. The memory map for the reverse tree of FIG. 7 is shown below in Table 4. Table 4 is alternatively referred to as the encoder table.

TABLE 4

| Present Address | Next Address | Encoded bit(s) |
| --- | --- | --- |
| 0 | 4 | 00 |
| 1 | 8 | 01 |

TABLE 4-continued

| Present Address | Next Address | Encoded bit(s) |
| --- | --- | --- |
| 2 | 5 | 10 |
| 3 | 6 | 10 |
| 4 | 6 | 00 |
| 5 | 9 | 01 |
| 6 | 10 | 11 |
| 7 | 5 | 00 |
| 8 | 9 | 00 |
| 9 | 10 | 01 |
| 10 | special code | 00 |

The decoder and encoder structures described above are advantageously combined together in a single architecture in the decoder/encoder device 100 of the present invention. In fact, in a preferred embodiment, these decoder and encoder structures are combined into a single VLSI chip including the circuit elements set forth in FIG. 6. To operate decoder/encoder device 100, the decoder 2 bit tree and its reverse tree are preloaded into memory (MM) 105. If there is any gap in the decoder memory map stored in memory 105, this memory space is utilized by the encoder memory map since many of its non-leaf nodes can be freely placed anywhere in memory 105. The beginning addresses of these tables are made available to the global control represented as control 195 in FIG. 6.

When the D/E (decode/encode) signal which is provided to demultiplexor (DMUX2) 117 is set to 1, device 10 acts as a decoder. If the D/E signal is set to 0, then device 100 acts as an encoder.

The decoder operation function as follows. Flip flops T, B and F are preset by reading a memory word from a specified location. The decoder control circuit 145 then generates a shift signal to read one or two bits from the input bit string received by shift register (A) 135. The input bit string is thus assembled into a number C that is added to the next address in adder 155. The demultiplexor (DMUX2) 117 selects t and b bits to the control which along with the f bit information is able to generate all local control signals. If a terminal symbol is reached, the demultiplexor (DMUX1) 16 sends the contents of memory data register (MDR) 115 (excluding the three least significant bits) to the output buffer (SYMBOL) 170. It will thus be appreciated that the hardware shown in FIG. 6 implements the steps of the decoding method discussed earlier.

The encoder operation functions as follows. For the encoding operation, the input symbols are used to access memory (MM) 105 via address decoder 175. The two least significant bits of the memory data register (MDR) 115 are selected for output to the FIFO register 180. The control flip-flop (L) 190, set by the length code detector 185, allows reading only one or two bits into FIFO register 180 depending on the length of the label in the reverse tree as discussed earlier. It is noted that during the encoding operation the adder circuit 155 can be bypassed since the next address is directly read from memory data register (MDR) 115. During encoding, the address computation and the memory access can be readily pipelined for successive pairs of bits to be decoded to achieve high throughput. Although a 2 bit implementation of decoder/encoder device 100 has been discussed above, device 100 is easily reconfigured to perform single bit decoding/encoding. Embodiments of the invention having bit widths other than 1 or 2 can also be implemented consistent with the teachings herein. To implement decoding/encoding of a 1 bit wide code, the 1 bit binary tree and 1 bit reverse binary tree is employed consistent with earlier discussion. In such an embodiment, the addition cycle can be avoided for next address computation in the decoder by shifting the next address left one bit and by appending rather than adding, the terminal bit. It is noted that in this case, the backup bit is not required. The next address is half of the original address. In such an embodiment, flip flops T, B and CH are not required since both encoding and decoding processes handle one bit in every cycle.

Figure 8:
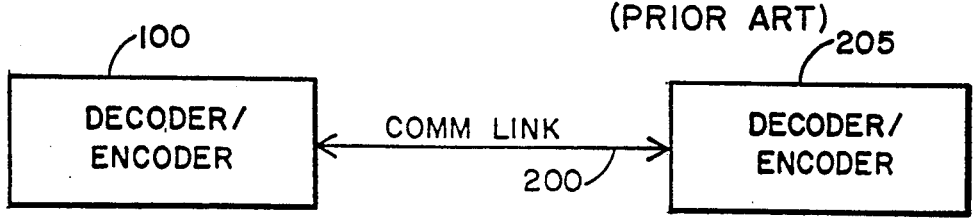
FIG. 8 is a block diagram of a communications network employing the decoder/encoder of the present invention.

FIG. 8 shows a communications network which employs a encoder/decoder device 100 coupled via a communications link 200 to an encoder/decoder device 205 which is substantially identical to device 100. Communications link 205 is a wire-line, radio, optical, satellite microwave or other link which is capable of transmitting and receiving data. Each of devices 100 and 205 operate in the manner discussed earlier. The method of programming device 100 to encode and decode a particular type of binary code has already been discussed in detail. In the communications network of FIG. 8, each of decoder/encoder devices 100 and 205 are programmed to decode and encode the same code. In this manner devices 100 and 205 can communicate with each other. When device 100 is sending a message to device 205, device 100 encodes the message before sending the message over link 200 to device 205. When device 205 receives the message, device 205 decodes the message. Similarly, when device 205 is sending a message to device 100, device 205 encodes the message before sending the message over link 200 to device 100. When device 100 receives the message, device 100 decodes the message in the manner described earlier. As long as devices 100 and 205 are programmed to used the same binary code on each end of the link, devices 100 and 205 can communicate. It will be appreciated that other like decoder/encoder devices can be readily added to the communications network depicted in FIG. 8.

It is noted that the decoder/encoder device hardware described above is programmable in the sense that any tree-based code (Huffman, Shannon-Fano, Elias, etc.) can be implemented on the same hardware. The required preprocessing step includes preloading memory (MM) 105 with the appropriate memory maps for the particular selected code. In actual practice, memory maps for several different binary codes may be loaded simultaneously in memory. Switching from one code to another is accomplished by making the starting addresses of such different maps available to the control circuitry within device 100. In this manner, it is seen that the architecture of device 100 is readily adaptable to adaptive codes. More particularly, this is accomplished by employing a two port memory as memory 105. The write port of such two port memory is used to load to a different part of memory an updated memory map computed by a host processor (not shown, but coupled to device 100) based on the most recent statistics of the frequency of distribution of symbols. At appropriate intervals of time, the status of the read and write ports are switched thus adapting to new codes.

For an arbitrary k, the average height of the decoder tree will be reduced by a factor of 1/k and the size of the memory map will be decreased by a factor $\frac{1}{2}^k$ with an increase in word size by $\log_2 k$ additional bits. A speedup of k in the decoding/encoding process compared to the case of k=1 will occur in most situations, where k bits are processed in each cycle, such as a memory access cycle in the case of a computer implemented process. It is noted that $s = \log_2 k$ bits $b_1, b_2, \ldots b_s$ are required to indicate the possibility of a potential backup with $0, 1, 2 \ldots k-1$ bits in the decoder and the same number of control bits L are required to indicate how many of the encoded bits represent valid output bits. The reading of the input bits to the input buffer (not shown) coupled to address decoder 175 can be handled by a shifter which can shift $1, 2, 3, \ldots k$ bits, etc. Thus, even if it is assumed that the cost of control circuits is linearly proportional to k, a linear speedup in throughput can be achieved with a factor of $2^k$ in savings of memory space.

While a method for encoding and decoding has been described above, it is clear that apparatus for encoding and decoding data has also been described. In summary, the encoder apparatus for encoding data includes a receiving circuit for receiving the data to be encoded. The encoder apparatus further includes a memory having a plurality of memory locations and a preloading circuit coupled to the memory. The preloading circuit loads the memory with a memory map which is descriptive of a selected tree-based binary code. The memory map thus loaded is a reverse tree representation of the selected tree-based binary code. The encoder apparatus further includes a processing circuit, coupled to the memory, for processing the data as specified by the memory map to encode the data, thus generating encoded data. The preloading circuit includes circuitry for loading an encoding tree into the memory wherein the encoding tree is a reverse tree including a root node and a plurality of leaf nodes. The leaf nodes are mapped into memory locations within the memory in one to one correspondence therewith.

Also in summary, the decoder apparatus for decoding data includes a receiving circuit for receiving data to be encoded and a memory including a plurality of memory locations. The decoder apparatus further includes a preloading circuit, coupled to the memory, for preloading the memory with a memory map descriptive of a selected tree-based binary code. The memory map is a tree representation of the selected tree-based binary code. The apparatus also includes a processing circuit, coupled to the memory, for processing the data as specified by the memory map to decode the data thus generating decoded data. The preloading circuit includes circuitry for loading a decoding tree into the memory, such decoding tree including a root node and a plurality of leaf nodes. The leaf nodes are mapped into the memory locations within the memory in one to one correspondence therewith.

The foregoing describes a memory based decoder/encoder architecture and method of operation which are advantageously employed for the real-time compression/decompression of data. The decoder/encoder apparatus can be programmed to encode and decode different binary codes. The decoder/encoder device is readily fabricated in a VLSI implementation since the device employs standard modules such as a memory, adder, shift register, multiplexors and demultiplexors as building blocks. The speed at which the device encodes or decode depends on the size of the memory employed. The decoder/encoder device may advantageously be employed in space communication, image data compression, and text and scientific data compression.

While only certain preferred features of the invention have been shown by way of illustration, many modifications and changes will occur to those skilled in the art.

It is, therefore, to be understood that the present claims are intended to cover all such modifications and changes which fall Within the true spirit of the invention.

What is claimed is:

1. A method for encoding data in an encoder, said encoder including a memory having a plurality of memory locations containing data for simultaneous generation of multiple bits of tree-based binary codes in a single memory access cycle, said method comprising the steps of:
    preloading said memory with a memory map descriptive of a selected multiple bit tree-based binary code, said memory map being a reverse tree representation of said selected multiple bit tree-based binary code;
    providing data to said encoder; and
    encoding multiple bits of said data in each memory access cycle as specified by said memory map to generate encoded data.

2. The method of claim 1 wherein said preloading step comprises loading an encoding tree into said memory, said encoding tree being a multiple bit reverse binary tree including a root node and a plurality of leaf nodes, said leaf nodes being mapped into said memory locations within said memory in one to one correspondence therewith.

3. A method for decoding data in an decoder, said decoder including a memory having a plurality of memory locations, each memory location containing data for simultaneous decoding of multiple bits of a tree-based binary code in a single memory access cycle, said method comprising the steps of:
    preloading said memory with a memory map descriptive of a selected multiple bit tree-based binary code;
    providing data to said decoder; and
    decoding multiple bits of said data in each memory access cycle as specified by said memory map to generate decoded data.

4. The method of claim 3 wherein said preloading step comprises loading a multiple bit binary decoding tree into said memory, said decoding tree including a root node and a plurality of leaf nodes, said leaf nodes being mapped into said memory locations within said memory in one to one correspondence therewith.

5. A method for decoding and encoding data in an decoder/encoder, said decoder/encoder including a memory, said method comprising the steps of:
    preloading said memory with a first memory map descriptive of a selected tree-based binary code, said first memory map being a multiple bit reverse tree representation of said selected tree-based binary code;
    preloading said memory with a second memory map descriptive of said selected multiple bit binary tree-based binary code, said second memory map being a tree representation of said selected tree-based binary code;
    providing first data to said decoder/encoder;
    encoding said first data as specified by said first memory map;
    providing second data to said decoder/encoder; and
    decoding said second data as specified by said second memory map.

6. An encoder apparatus for encoding data comprising:
    means for receiving data to be encoded;
    a memory including a plurality of memory locations;
    preloading means, coupled to said memory, for preloading said memory with a memory map descriptive of a selected tree-based binary code, said memory map being a multiple bit reverse tree representation of said selected tree-based binary code; and
    processing means, coupled to said memory, for processing said data as specified by said memory map to encode said data.

7. The encoder apparatus of claim 6 wherein said preloading means further includes means for loading an encoding tree into said memory, said encoding tree being a multiple bit reverse tree including a root node and a plurality of internal and leaf nodes, at least some of said internal nodes and said leaf nodes being mapped into said memory locations within said memory in one to one correspondence therewith.

8. An decoder apparatus for decoding data comprising:
    means for receiving data to be decoded;
    a memory including a plurality of memory locations;
    preloading means, coupled to said memory, for preloading said memory with a memory map descriptive of a selected tree-based binary code, said memory map being a multiple bit tree representation of said selected tree-based binary code; and
    processing means, coupled to said memory, for processing said data as specified by said memory map to decode said data.

9. The apparatus of claim 8 wherein said preloading means further includes means for loading a decoding tree into said memory, said decoding tree including a root node and a plurality of leaf nodes, said leaf nodes being mapped into said memory locations within said memory in one to one correspondence therewith.

10. A decoder/encoder apparatus for decoding and encoding data comprising:
    first receiving means for receiving first data to be encoded;
    second receiving means for receiving second data to be decoded;
    a memory;
    first preloading means, coupled to said memory, for loading said memory with a first memory map descriptive of a selected tree-based binary code, said first memory map being a multiple bit reverse tree representation of said selected tree-based binary code;
    second preloading means, coupled to said memory, for loading said memory with a second memory map descriptive of said selected tree-based binary code, said second memory map being a multiple bit tree representation of said selected tree-based binary code; and
    processing means, coupled to said memory, for processing said first data as specified by said first memory map to encode said data and for processing said second data as specified by said second memory map to decode the data.

* * * * *

UNITED STATES PATENT AND TRADEMARK OFFICE
CERTIFICATE OF CORRECTION

PATENT NO.  : 5,216,423
DATED       : June 1, 1993
INVENTOR(S) : Amae Mukherjee

It is certified that error appears in the above-identified patent and that said Letters Patent is hereby corrected as shown below:

On the title page, Item [75] Inventor should read:

-- Amar Mukherjee. --

Signed and Sealed this

Eighth Day of March, 1994

Attest:

BRUCE LEHMAN

Attesting Officer

Commissioner of Patents and Trademarks